United States Patent
Bjorkholm et al.

(10) Patent No.: US 6,815,129 B1
(45) Date of Patent: Nov. 9, 2004

(54) COMPENSATION OF FLARE-INDUCED CD CHANGES EUVL

(75) Inventors: John E. Bjorkholm, Pleasanton, CA (US); Daniel G. Stearns, Los Altos, CA (US); Eric M. Gullikson, Oakland, CA (US); Daniel A. Tichenor, Castro Valley, CA (US); Scott D. Hector, Oakland, CA (US)

(73) Assignee: EUV LLC, Santa Clara, CA (US)

( * ) Notice: Subject to any disclaimer, the term of this patent is extended or adjusted under 35 U.S.C. 154(b) by 275 days.

(21) Appl. No.: 09/669,958

(22) Filed: Sep. 26, 2000

(51) Int. Cl.[7] ............................................. G03F 9/00
(52) U.S. Cl. ............................................ 430/30; 430/5
(58) Field of Search ....................................... 430/5, 30

(56) References Cited

U.S. PATENT DOCUMENTS

| | | | |
|---|---|---|---|
| 5,242,770 A | 9/1993 | Chen et al. | 430/5 |
| 5,705,301 A | * 1/1998 | Garza et al. | 430/5 |
| 5,903,400 A | 5/1999 | Endo | 359/758 |
| 5,946,079 A | 8/1999 | Borodovsky | 355/67 |
| 5,994,009 A | 11/1999 | Tzu et al. | 430/30 |

FOREIGN PATENT DOCUMENTS

WO    WO99/46807 A1    9/1999

OTHER PUBLICATIONS

D.G. Stearns, et al., Nonspecular x–ray scattering in a multilayer–coated imaging system, J. of Applied Phys., vol. 84, No. 2, Jul. 15, 1998.

D.G. Stearns, et al., Nonspecular scattering from extreme ultraviolet multilayer coatings, Physica B 283 (2000) 84–91.

J.P. Kirk, Scattered light in photolithographic lenses, SPIE vol. 2197, 566–572, 1/94.

E.M. Gulikson, et al., EUV Scattering and Flare of 10x Projection Cameras, SPIE vol. 3676, 717–723, 1999.

Patent Abstracts of Japan vol. 2000, No. 25 Apr. 12, 2001, JP 2001 222097A.

* cited by examiner

*Primary Examiner*—Christopher G. Young
(74) *Attorney, Agent, or Firm*—John P. Wooldridge; Alan H. Thompson

(57) ABSTRACT

A method for compensating for flare-induced critical dimensions (CD) changes in photolithography. Changes in the flare level results in undesirable CD changes. The method when used in extreme ultraviolet (EUV) lithography essentially eliminates the unwanted CD changes. The method is based on the recognition that the intrinsic level of flare for an EUV camera (the flare level for an isolated sub-resolution opaque dot in a bright field mask) is essentially constant over the image field. The method involves calculating the flare and its variation over the area of a patterned mask that will be imaged and then using mask biasing to largely eliminate the CD variations that the flare and its variations would otherwise cause. This method would be difficult to apply to optical or DUV lithography since the intrinsic flare for those lithographies is not constant over the image field.

32 Claims, 2 Drawing Sheets

COMPENSATION OF FLARE-INDUCED CD CHANGES EUVL

The United States Government has rights in this invention pursuant to Contract No. DE-AC04-94AL85000 and Contract No. W-7405ENG-48 between the United States Department of Energy, the Sandia Corporation, and the University of California for the respective operation of the Sandia National Laboratories and the Lawrence Berkeley National Laboratory.

BACKGROUND OF THE INVENTION

The present invention relates to extreme ultraviolet lithography (EUVL), particularly to compensation of flare-induced CD changes in EUVL. More particularly, it relates to a method for substantially eliminating flare-induced CD changes by calculating flare and its variation over the area of a patterned mask and then using mask biasing to eliminate the CD variations caused by flare and its variations, The scattering of light by the components of lithographic cameras is a problem of ever-increasing importance for the semiconductor industry. Scattering causes the redirection of light from an area of an image intended to be bright into all areas of the image, including those regions intended to be dark. The resulting background illumination is called "flare," which reduces image contrast and the process window for printing. More importantly, flare also has a detrimental effect on the dimensions of critical features, referred to as critical dimensions (CD), and thus has a detrimental effect on CD control; localized flare variations (which are inevitable), lead to localized CD variations. In the manufacture of semiconductor devices, such as microprocessors, it is extremely important that the CD's are very accurately controlled.

The dimensions of critical circuit features or CD's are defined by optical lithography and the associated processing steps. There are numerous effects that can cause CD's to deviate from the desired targets. Among these is the background illumination or flare in the image projected by the camera, caused by light scattering within the camera. In optical lithography and deep ultraviolet (DUV) lithography (248–157 nm) the intrinsic flare of the camera varies over the image field; additionally, there are flare variations in the projected image that are caused by variations in the density of absorbers on the photomask. These flare variations cause CD variations. Because the intrinsic flare of optical and DUV cameras varies over the image field, it has not been possible in the past to compensate for flare-induced CD changes. Instead, emphasis has been placed upon reducing flare as much as possible.

In principle the compensation technique of this invention could be applied to optical and DUV, but its implementation may be so cumbersome as to be impractical. In optical and DUV one would need to compensate for across-field flare variations as well as within-die flare variations. In EUVL, flare is essentially constant across the field.

The intrinsic flare levels in extreme ultraviolet lithography (EUVL) cameras will most likely be higher than experienced in optical and DUV cameras. However, the intrinsic flare of EUVL cameras is essentially constant over the image field. Based on the recognition of this difference in intrinsic flare between optical and DUV cameras and EUV cameras, the method of the present invention makes it practical to compensate for the CD changes caused by flare and its variations caused by the absorber density variations on the photomask.

The compensation provided by the method of the present invention is accomplished by biasing the photomask, which means changing the dimensions of features on the photomask so that all features on the mask print within the desired CD range. Mask biasing is used today to compensate for CD variations caused by optical proximity effects, but has not been previously used to also correct for flare-induced CD variation. It is the recognition that the intrinsic flare of EUVL cameras is essentially constant over the image field that makes the use of the compensation techniques of the present invention practical. Basically the method of the invention involves calculating the flare and its variation over the area of a patterned mask that will be imaged and then using mask biasing to largely eliminate the CD variations that the flare and its variations would otherwise cause.

SUMMARY OF THE INVENTION

It is an object of the present invention to eliminate unwanted changes of critical dimensions or CD's in extreme ultraviolet (EUV) lithography.

A further object of the invention is to provide compensation of flare-induced CD changes in EUVL.

Another object of the invention is to provide a method to eliminate flare-induced CD changes, particularly in EUVL systems.

Another object of the invention is to provide a method for reducing or eliminating undesirable CD changes which are flare-induced based on the realization that the intrinsic level of flare for an EUV camera is essentially constant over the image field.

Another object of the invention is to provide a method for compensation of flare-induced CD changes in EUV lithography which involves calculating the flare variation over the area of a patterned mask and then using mask biasing to largely eliminate the CD variations that the flare and its variations would otherwise cause.

Other objects and advantages of the present invention will become apparent from the following description and accompanying drawing. Basically the invention is directed to compensation of flare-induced CD changes in photolithography, particularly EUV lithography. Unlike optical lithography and DUV lithography, wherein the intrinsic flare varies over the image field, the intrinsic level of flare for an extreme ultraviolet (EUV) camera (the flare level for sub resolution opaque dot in a bright field mask) is essentially constant over the image field, (changing only very near the edges of the field). Based on this recognition, compensation of flare-induced CD changes in EUV cameras can be made in accordance with the method of the present invention, which basically involves calculating the flare and its variation over the area of a patterned mask that will be imaged and then using mask biasing to largely eliminate the CD variations that the flare and its variations would otherwise cause. The general method of this invention is, in principle, applicable to optical or DUV lithography but it is impractical to implement since the intrinsic flare for those lithographies is not constant over the image field.

BRIEF DESCRIPTION OF THE DRAWINGS

The accompanying drawing, which is incorporated into and forms a part of the disclosure, illustrates the effects of light scattering on image formation and, together with the description, serve to explain the principles of the invention.

DETAILED DESCRIPTION OF THE INVENTION

The present invention is directed to a method for compensation of flare-induced CD changes in photolithography, particularly extreme ultraviolet lithography (EUVL). As pointed out above, the scattering of light by the components of lithographic cameras is a problem, since light scattering causes the redirection of light from an area of an image intended to be bright into all areas of the image, including those regions intended to be dark. The resulting background illumination is known in the art as flare, which reduces image contrast and the process window for printing. As also pointed out above, flare has a detrimental effect the dimensions of critical circuit features, referred to as critical dimensions or CD's. Flare also has a detrimental effect on CD control; localized flare variations, which are inevitable, lead to CD variations. The method of the present invention provides compensation for these flare-induced CD changes.

Figure 1:
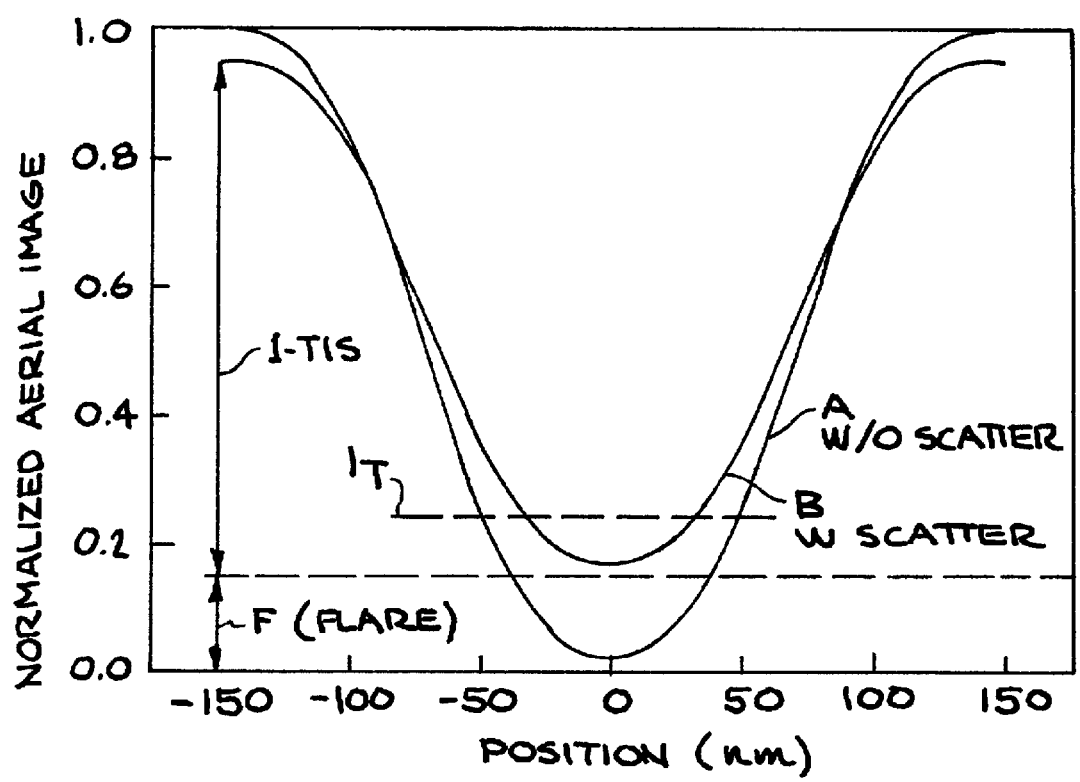
FIG. 1 is a schematic diagram that illustrates the way in which light scattering reduces the contrast of the aerial image and how the presence of flare changes the printed CD for the case of an isolated line.

FIG. 1 is a schematic diagram that illustrates the way in which light scattering reduces the contrast of the aerial image and in the way that the presence of flare changes the printed CD for the case of an isolated line. The normalized aerial images with and without flare are shown. As seen in the figure, the aerial image of an isolated 100 nm dark line in a bright field is imaged by a 0.08 NA EUV camera using radiation at 13.4 nm with a partial coherence of 0.7. The curve A shows the aerial image obtained with a scatter-free camera; the image has been normalized to a bright-field intensity of 1. The curve B is obtained with a similar camera that has scatter; the total scattering (TIS) was taken to be 20% and the flare level to be 15%. The intensity level $I_T$ is the resist threshold level that produces the correct CD for the case without scatter (curve A). In the presence of scatter (curve B), the resulting flare changes the aerial image so that the value $I_T$ results in the printing of a smaller CD. Furthermore, the flare level will be a function of position in the mask. These variations of the flare over the mask result in further CD variations. The method of this invention uses mask biasing to compensate for the base CD changes as well as its variation over the mask.

The effects of light scattering have become more important in lithography as the wavelength of light used to carry out the imaging has evolved from 365 nm (used in the recent past) to 248 nm (currently in use) to 193 nm (soon to be deployed). Generally speaking, light scattering increases rapidly as the wavelength is reduced. The maximum flare level in high quality 248 nm DUV cameras is only several percent, but the impact of flare variations can be considerable. For example, under typical DUV imaging conditions, a change in the absolute flare of 1% will cause a change in the printed CD of an isolated line of about 2.5%. Optical and DUV lithographic cameras contain refractive optical elements whereas EUV cameras are totally reflective. As a consequence, the intrinsic flare of optical and DUV cameras varies more or less continuously over the image field by about a factor of 2 whereas the intrinsic flare of EUV cameras is essentially constant over the image field.

EUVL cameras are all-reflective and use radiation in the vicinity of 13 nm to carry out imaging. In EUVL, light scattering is caused primarily by the surface roughness of the camera's mirrors. The relative importance of flare in EUVL is even more important than it is in DUV lithography. This is because the magnitude of flare due to scattering by surface roughness is proportional to $1/\lambda^2$, everything else being constant. It is anticipated that the maximum flare levels in EUVL cameras may be as much as 5% to 10%. The method of this invention will produce a significant effect on the reduction of CD changes resulting from flare and its variation over the mask.

The qualitative behavior of flare in EUVL cameras is considerably different than the behavior in DUV cameras, and it is the difference that enables the use of the compensation method of this invention. First consider the flare experienced by a dark, isolated sub-resolution dot in a bright field mask. This is called the intrinsic flare of the camera. As pointed out above, in a DUV camera the intrinsic flare varies more or less continuously from a maximum value in the center of the image field to a value of about one half that amount at the field edges. This variation of flare in a DUV camera causes printed CD to vary over the field, a problem known as "across-chip linewidth variation (ACLV)." By contrast, it has been discovered that the intrinsic flare in an EUVL camera is essentially constant over most of the image field. At the field edges the flare level falls to a value of about one half of the value elsewhere, but the fall-off occurs over a short distance of several hundred microns or less. That is to say, the intrinsic flare is essentially constant over the vast majority of the image field. It is this recognition that makes practical the compensation method of the present invention for EUV lithography.

Now consider what happens when an image contains a patterned mask. Because the mask contains a patterned absorber there is less scattered light than experienced with a bright field mask. Secondly, the scattered light incident on a given point in the projected image of the mask comes from a restricted region surrounding that point. As a result, the flare experienced by a given mask feature is determined by the mask features surrounding it. It then follows that the printed CD for a given mask feature in the projected image depends on its surroundings. For example, the flare for dense lines and spaces is one half of the intrinsic flare at that point in the field and the flare for an isolated bright line in a dark field is essentially zero. This localized flare dependence may be thought of as a form of optical proximity effect and it causes the problem known as "within-die CD variation." For a DUV camera, this within-die flare variation is superimposed on the across-field flare variation. This makes it so difficult to compensate for flare variations in DUV lithography that such compensation has not been carried out. For EUV cameras, there is essentially no across-field flare variation and compensation for flare variations for within-die, flare-induced CD variation is practical using the method of this invention and described hereinafter.

Figure 2:
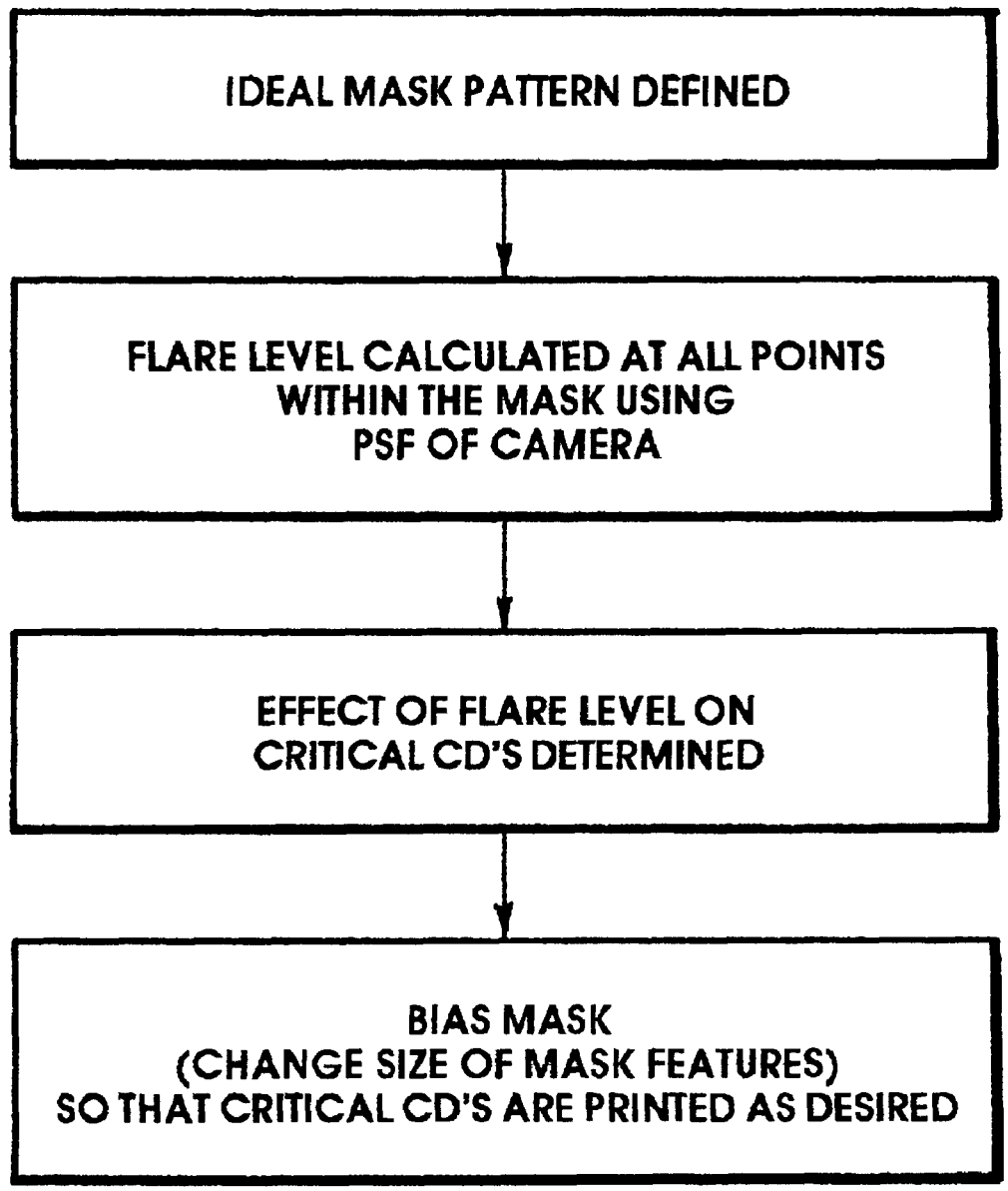
FIG. 2 is a diagram showing the various operations involved in carrying out the method of the invention for compensation of flare-induced CD changes in extreme ultraviolet lithography.

The method used to compensate for within-die, flare-induced CD variations, as diagrammed in FIG. 2 is as follows:

1. First, determine the contribution that scattering makes to the point spread function (PSF) of the camera. This is done by measuring the power spectral densities (PSD's) of the roughness of the mirrors that comprises the camera. The procedure for calculating the PSF due to scattering from the mirror PSD's is described in D. G. Stearns, et al., "Nonspecular x-ray scattering in a multilayer-coated imaging system," J. Appl. Phys. 84, pp. 1002–1028 (1998), and in D. G. Stearns, et al, "Nonspecular scattering from extreme ultraviolet multilayer coatings," Physica B 283, pp. 84–91

(2000). These papers discuss the details of how the scattered radiation propagates through the camera.

2. Alternatively, the PSF of the camera (including the effects of diffraction and scattering) can be measured using EUV scatterometry and/or interferometry as described in E. M. Gullikson, et al., "EUV scattering and flare of 10× projection cameras," Proc. SPIE 3676, pp. 717–723 (1999). This paper describes how the PSF, due to scattering, can be experimentally measured directly by scattering measurements or indirectly by EUV interferometry.

As a check, the flare level can be experimentally measured at many points within the exposure field using well-known techniques, see J. P. Kirk, "Scattered light in photolithographic lenses," Proc. SPIE 2197, 566 (1994). This technique uses resist exposures to determine flare levels and can be used specifically for determining the intrinsic flare of a camera. This result can then be compared with the predictions made using the results obtained in operation "1" above.

3. Calculate the aerial image of the mask pattern that is to be imaged. This result yields the variation of the flare over the projected aerial image. This calculation is carried out by convolving the PSF due to scattering with the aerial image produced by the camera in the absence of scattering. One can obtain a good approximation to the aerial image by convolving the PSF due to scattering with the ideal aerial image of the mask, which neglects the effects of aberrations and diffraction. This calculation yields an excellent approximation for the flare as a function of position in the projected mask pattern.

4. Based on the aerial image calculated in operation "3" above, determine the printed CD's of all the critical features on the mask. This is done by using the simple resist threshold model or it can be done more accurately by using a detailed resist model that incorporates various processing steps such as post-exposure bakes and development. Alternatively, one can use the calculated flare and its variation over the projected mask pattern in conjunction with a lookup table to determine the approximate amount of mask bias required at various positions on the mask. A lookup table could also be constructed from experimentally measured CD's for a print of an unbiased mask.

5. Based on the results obtained in operation "4" above, bias the mask features (i.e., change their dimensions) so that each of them prints with the desired CD. The biasing is carried out in the mask making process. That is, the biased mask is fabricated using the usual techniques, but with feature dimensions changed (or biased) to yield the desired CD in the presence of the flare.

While the above described operations require much detailed work, they are very similar to the optical proximity calculations that are carried out today to compensate for proximity effects due to diffraction.

Generally, it is always advantageous to first minimize the flare in the aerial image before carrying out the above described process. One approach for doing this is to determine whether a bright field mask or a dark field mask will yield the least amount of flare. Using a bright field mask, used with a positive photoresist, will convey more light to the camera than will a dark field mask used with a negative photoresist. Consequently, a bright field mask will generally be associated with more flare than will a dark field mask.

The procedures outlined above have been described with standard binary masks in mind; however, they apply equally well to other masks, such as the many varieties of phase masks.

It has thus been shown that the present invention provides a method to the compensation of flare-induced CD changes in photolithography, particularly EUV lithography. The method relies on the realization that the intrinsic level of flare for an EUV camera is essentially constant over the image field, and involves calculating the flare and its variation over the area of a patterned mask that will be imaged and then using mask biasing to largely eliminate the CD variations that these flare variations would otherwise cause.

While particular operational sequences have been set forth to exemplify and describe the principles of the invention, such are not intended to be limiting. Modifications and changes may become apparent to those skilled in the art, and it is intended that the invention be limited only by the scope of the appended claims.

What is claimed is:

1. A method for compensating for flare-induced critical dimension changes in photolithography, comprising:
   calculating the flare variation over the area of a patterned mask that will be imaged, and
   using mask biasing to largely eliminate the critical dimension changes caused by flare and its variations.

2. The method of claim 1, wherein calculating the flare variation is carried out by determining the contribution that scattering makes to the point spread function of the camera; calculating the aerial image of the mask pattern that is to be imaged which yields the variation of the flare over the projected aerial image; and based on the aerial image calculated, determining the printed critical dimensions of all the critical features of the mask; then biasing the mask so that the desired critical dimensions are printed.

3. The method of claim 1, wherein mask biasing is carried out in a mask fabrication process.

4. The method of claim 2, wherein determining the contribution that scattering makes to the point spread function of the camera is carried out by measuring the power spectral densities of the roughness of the mirrors that comprise the camera.

5. The method of claim 2, wherein determining the contribution that scattering makes to the point spread function of the camera, including the effects of diffraction and scattering, is carried out by using extreme ultraviolet interferometry.

6. The method of claim 2, wherein determining the contribution that scattering makes to the point spread function of the camera, additionally includes checking the intrinsic flare level experimentally including measuring the flare level at many points within the exposure field, comparing the measurements with the calculations.

7. The method of claim 2, wherein calculating the aerial image of the mask pattern that is to be imaged is carried out by convolving the point spread function due to scattering with the aerial image produced by the camera in the absence of scattering.

8. The method of claim 2, wherein the method is carried out using a bright field mask or a dark field mask.

9. The method of claim 2, wherein calculating the aerial image of the mask pattern that is to be imaged is carried out by obtaining an approximation to the aerial image by convolving the point spread function of the camera due to scattering with the ideal aerial image of the mask, which neglects the effects of aberrations and diffraction.

10. The method of claim 1, wherein calculating the flare variation is carried out by convolving the point spread function of the camera due to scatter with the ideal aerial image of the mask.

11. The method of claim 2, wherein determining the printed critical dimensions of all the critical features of the mask is carried out using a simple resist threshold model or by using a detailed resist model that incorporates various processing steps including post-exposure bakes and development.

12. The method of claim 1, wherein calculating the flare variation over the projected mask pattern is carried out using tables constructed from experimentally measured critical dimensions for a print of an unbiased mask.

13. The method of claim 1, additionally including using an extreme ultraviolet camera.

14. A method for eliminating unwanted critical dimension changes in extreme ultraviolet lithography, which includes:
   calculating the flare variation over an area of a patterned mask, and mask biasing to eliminate the critical dimension changes.

15. In an extreme ultraviolet camera, the improvement comprising: compensating for flare-induced critical dimension changes.

16. The improvement of claim 15, which is carried out by calculating the flare variation over an area of a patterned mask to be imaged by the camera, and using mask biasing to eliminate critical dimension variations caused by flare variations.

17. The method of claim 1, additionally including minimizing the flare in the aerial image before calculating the flare variation by utilizing either a bright field mask or a dark field mask.

18. The method of claim 17, wherein a bright field mask is used with a positive photoresist.

19. The method of claim 17, wherein a dark field mask is used with a negative photoresist.

20. The method of claim 1, wherein calculating the flare variations is carried out using a phase-shift mask.

21. The method of claim 14, wherein calculating the flare variation is carried out by determining the contribution that scattering makes to the point spread function of the camera; calculating the aerial image of the mask pattern that is to be imaged which yields the variation of the flare over the projected aerial image; and based on the aerial image calculated, determining the printed critical dimensions of all the critical features of the mask; then biasing the mask so that the desired critical dimensions are printed.

22. The method of claim 14, wherein mask biasing is carried out in a mask fabrication process.

23. The method of claim 21, wherein determining the contribution that scattering makes to the point spread function of the camera is carried out by measuring the power spectral densities of the roughness of the mirrors that comprise the camera.

24. The method of claim 21, wherein determining the contribution that scattering makes to the point spread function of the camera, including the effects of diffraction and scattering, is carried out by using extreme ultraviolet interferometry.

25. The method of claim 21, wherein determining the contribution that scattering makes to the point spread function of the camera, additionally includes checking the intrinsic flare level experimentally including measuring the flare level at many points within the exposure field, comparing the measurements with the calculations.

26. The method of claim 21, wherein calculating the aerial image of the mask pattern that is to be imaged is carried out by convolving the point spread function due to scattering with the aerial image produced by the camera in the absence of scattering.

27. The method of claim 21, wherein the method is carried out using a bright field mask or a dark field mask.

28. The method of claim 21, wherein calculating the aerial image of the mask pattern that is to be imaged is carried out by obtaining an approximation to the aerial image by convolving the point spread function of the camera due to scattering with the ideal aerial image of the mask, which neglects the effects of aberrations and diffraction.

29. The method of claim 14, wherein calculating the flare variation is carried out by convolving the point spread function of the camera due to scatter with the ideal aerial image of the mask.

30. The method of claim 21, wherein determining the printed critical dimensions of all the critical features of the mask is carried out using a simple resist threshold model or by using a detailed resist model that incorporates various processing steps including post-exposure bakes and development.

31. The method of claim 14, wherein calculating the flare variation over the projected mask pattern is carried out using tables constructed from experimentally measured critical dimensions for a print of an unbiased mask.

32. The method of claim 14, additionally including using an extreme ultraviolet camera.

* * * * *